US008786355B2

(12) United States Patent
Hao et al.

(10) Patent No.: US 8,786,355 B2
(45) Date of Patent: Jul. 22, 2014

(54) LOW-POWER VOLTAGE REFERENCE CIRCUIT

(75) Inventors: Wuyang Hao, San Diego, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/293,850

(22) Filed: Nov. 10, 2011

(65) Prior Publication Data

US 2013/0120050 A1 May 16, 2013

(51) Int. Cl.
*H01L 35/00* (2006.01)

(52) U.S. Cl.
USPC ........................................ 327/513; 323/313

(58) Field of Classification Search
USPC ........................................ 327/513
See application file for complete search history.

(56) References Cited

U.S. PATENT DOCUMENTS

| | | | | |
|---|---|---|---|---|
| 3,138,743 | A * | 6/1964 | Kilby | 257/539 |
| 5,109,187 | A * | 4/1992 | Guliani | 365/185.21 |
| 5,311,115 | A * | 5/1994 | Archer | 323/315 |
| 5,451,860 | A * | 9/1995 | Khayat | 323/314 |
| 5,589,800 | A * | 12/1996 | Peterson | 330/288 |
| 5,596,302 | A * | 1/1997 | Mastrocola et al. | 331/57 |
| 5,640,122 | A | 6/1997 | McClure | |
| 5,798,669 | A | 8/1998 | Klughart | |
| 5,942,912 | A * | 8/1999 | Thewes et al. | 326/36 |
| 5,966,005 | A | 10/1999 | Fujimori | |
| 6,100,754 | A * | 8/2000 | Kim et al. | 327/541 |
| 6,150,871 | A * | 11/2000 | Yee | 327/538 |
| 6,288,596 | B1 * | 9/2001 | Johansson et al. | 327/512 |
| 6,381,491 | B1 * | 4/2002 | Maile et al. | 607/2 |
| 6,734,719 | B2 * | 5/2004 | Tanzawa et al. | 327/541 |
| 6,888,402 | B2 * | 5/2005 | Geissler | 327/543 |
| 6,969,982 | B1 * | 11/2005 | Caldwell | 323/313 |
| 7,119,527 | B2 * | 10/2006 | Fernald | 323/315 |
| 7,259,614 | B1 | 8/2007 | Baker et al. | |
| 7,429,854 | B2 * | 9/2008 | Kimura | 323/315 |
| 7,486,129 | B2 * | 2/2009 | Pietri et al. | 327/539 |
| 7,642,843 | B2 * | 1/2010 | Riho | 327/543 |
| 7,724,077 | B2 * | 5/2010 | Bien | 327/543 |

(Continued)

FOREIGN PATENT DOCUMENTS

CN 101013332 A 8/2007

OTHER PUBLICATIONS

International Search Report and Written Opinion—PCT/US2012/064725—ISA/EPO—Dec. 4, 2013.

*Primary Examiner* — Thomas J Hiltunen
(74) *Attorney, Agent, or Firm* — Sam Talpalatsky; Nicholas J. Pauley; Joseph Agusta

(57) ABSTRACT

Methods and apparatus for a providing temperature-compensated reference voltage are provided. In an example, a temperature-compensated voltage reference circuit includes a current mirror portion and a temperature-compensated output portion coupled to the current mirror portion. The temperature-compensated output portion comprises a very low threshold voltage (Vt) transistor coupled in series with a negative temperature coefficient transistor. The output portion can further include a positive temperature coefficient element coupled in series with the very low Vt transistor. The positive temperature coefficient element can be an adjustable resistive element. The output portion can further include an output transistor having a gate coupled to the current mirror portion and coupled between a supply voltage and the positive temperature coefficient element. The very low Vt transistor can be a substantially zero Vt n-channel metal-oxide-semiconductor (NMOS) transistor, and can be coupled in a diode configuration.

21 Claims, 5 Drawing Sheets

(56) References Cited

U.S. PATENT DOCUMENTS

| | | | | |
|---|---|---|---|---|
| 7,936,205 | B2 * | 5/2011 | Kong et al. | 327/534 |
| 7,994,848 | B2 * | 8/2011 | Kothandaraman et al. | 327/539 |
| 8,154,272 | B2 * | 4/2012 | Kim et al. | 323/314 |
| 8,358,119 | B2 * | 1/2013 | Kim | 323/313 |
| 2006/0197585 | A1 * | 9/2006 | Kim et al. | 327/539 |
| 2007/0164812 | A1 | 7/2007 | Rao et al. | |
| 2008/0297229 | A1 * | 12/2008 | Ramamoorthy | 327/513 |
| 2010/0053582 | A1 | 3/2010 | De Nivelle | |
| 2010/0187714 | A1 * | 7/2010 | Kobiki et al. | 264/135 |
| 2010/0264980 | A1 | 10/2010 | Arguello | |
| 2010/0308902 | A1 * | 12/2010 | Iriarte et al. | 327/541 |
| 2011/0043185 | A1 * | 2/2011 | Kim | 323/313 |
| 2011/0163801 | A1 | 7/2011 | Chua-Eoan | |

* cited by examiner

LOW-POWER VOLTAGE REFERENCE CIRCUIT

FIELD OF DISCLOSURE

This disclosure relates generally to electronics, and more specifically, but not exclusively, to apparatus and methods for a low-power voltage reference circuit.

BACKGROUND

In conventional low-power voltage reference generators, when a target output voltage target is raised, output current must be increased to reach the target output voltage. Raising output current increases power consumption and generates excessive heat.

FIG. 1 depicts a conventional low-power voltage reference generator 100 that is a weak inversion CMOS voltage reference generator. A biasing current $I_B$ is generated and controlled by a self-stabilizing reference voltage circuit containing transistors Q1, Q2, Q3, and Q4, each of which function in saturated weak inversion. The biasing current $I_B$ varies non-linearly, and has a positive temperature coefficient. In other words, the biasing current $I_B$ increases with an increase in temperature. Through the self-stabilization feature of this circuit, the biasing current $I_B$ generates a control voltage that is input to transistors Q3 and Q5.

Transistors Q5 and Q6, as well as a resistor R, form a current mirror that mirrors the biasing current $I_B$. The voltage drop across resistor R and transistor Q6 caused by flow of the mirrored biasing current $I_B$ generates the voltage reference generator's 100 output voltage (Vo). The transistor Q5 operates under weak inversion in a sub-threshold region. Transistor Q6 is configured as a diode, thus the voltage drop across the transistor Q6 varies non-linearly, with a negative temperature coefficient. That is, the voltage drop across transistor Q6 decreases with an increase in temperature. The combined effects of temperature changes on the biasing current $I_B$ and the voltage drop across transistor Q6 tend to mitigate each other.

However, conventional voltage reference generators, such as the voltage reference generator 100, provide an output voltage that is too low for some applications. A conventional approach toward this problem includes increasing current flow through the device. Another conventional response to this problem uses bipolar transistors, which require excessive space. Accordingly, classic techniques for raising the output voltage increase power consumption, excessively increase temperature effects, and/or significantly increase circuit size.

Thus, there are long-felt industry needs for methods and apparatus that mitigate the shortcomings of conventional methods and apparatus, including a low-power voltage reference circuit that can achieve an increase in target output voltage over conventional devices without a commensurate increase in operating current and/or an excessive increase in circuit size.

SUMMARY

This summary provides a basic understanding of some aspects of the present teachings. This summary is not exhaustive in detail, and is neither intended to identify all critical features, nor intended to limit the scope of the claims.

In an example, methods and apparatus for providing a temperature-compensated reference voltage are provided. In an exemplary method, a current is controlled with a metal-oxide-semiconductor (MOS) transistor to mitigate a change in temperature. The current is passed through a very low threshold voltage (Vt) MOS transistor, such as a substantially zero Vt n-channel MOS transistor. The temperature-compensated reference voltage is generated by tapping across the substantially zero Vt MOS transistor. The current can be varied with a weighted transistor chain.

In another example, provided is a temperature-compensated voltage reference circuit. The voltage reference circuit includes means for controlling a current, with a metal-oxide-silicon (MOS) transistor, to mitigate a change in temperature. The voltage reference circuit also includes means for passing the current through a very low threshold voltage (Vt) MOS transistor, and means for generating the temperature-compensated reference voltage by tapping across the substantially zero Vt MOS transistor. Means for varying the current with a weighted transistor chain can also be provided.

The voltage reference circuit can be integrated in a semiconductor die, and can be integrated into a device, selected from the group consisting of a set-top box, music player, video player, entertainment unit, navigation device, communications device, personal digital assistant (PDA), fixed location data unit, and a computer. In a further example, provided is a non-transitory computer-readable medium, comprising instructions stored thereon that, if executed by a lithographic device, cause the lithographic device to fabricate at least a part of the voltage reference circuit.

In another example, provided is a temperature-compensated voltage reference circuit. The voltage reference circuit includes a current mirror portion and a temperature-compensated output portion coupled to the current mirror portion. The temperature-compensated output portion includes a very low threshold voltage (Vt) transistor, such as a substantially zero Vt n-channel metal-oxide-semiconductor (NMOS) transistor, coupled in series with a negative temperature coefficient transistor. The output portion can further include a positive temperature coefficient element coupled in series with the very low Vt transistor. The positive temperature coefficient element can be an adjustable resistive element. The output portion can further include an output transistor having a gate coupled to the current mirror portion and coupled between a supply voltage and the positive temperature coefficient element. In an example, the very low Vt transistor is coupled in a diode configuration.

The voltage reference circuit can be integrated in a semiconductor die, and can be integrated into a device, selected from the group consisting of a set-top box, music player, video player, entertainment unit, navigation device, communications device, personal digital assistant (PDA), fixed location data unit, and a computer. In a further example, provided is a non-transitory computer-readable medium, comprising instructions stored thereon that, if executed by a lithographic device, cause the lithographic device to fabricate at least a part of the voltage reference circuit.

In another example, provided is a non-transitory computer-readable medium, comprising instructions stored thereon that, if executed by a lithographic apparatus, cause the lithographic apparatus to fabricate at least a part of a device, such as the temperature-compensated voltage reference circuit described above. The device can include a current mirror portion and a temperature-compensated output portion coupled to the current mirror portion. The temperature-compensated output portion includes a very low threshold voltage (Vt) transistor, such as a substantially zero Vt NMOS transistor, coupled in series with a negative temperature coefficient transistor. The output portion of the device can further include a positive temperature coefficient element coupled in series with the very low Vt transistor. The positive temperature coefficient element can be an adjustable resistive element. The output portion can further include an output transistor having a gate coupled to the current mirror portion and coupled between a supply voltage and the positive temperature coefficient element. The very low Vt transistor can be coupled in a diode configuration.

The foregoing has broadly outlined some of the features and technical advantages of the present teachings in order that the detailed description that follows may be better understood. Additional features and advantages are also described. The conception and disclosed embodiments can be readily utilized as a basis for modifying or designing other structures for carrying out the same purposes of the present teachings. Such equivalent constructions do not depart from the technology of the teachings as set forth in the appended claims. The novel features which are characteristic of the teachings, together with further objects and advantages, are better understood from the detailed description and the accompanying figures. Each of the figures is provided for the purpose of illustration and description only, and does not define limits of the present teachings.

BRIEF DESCRIPTION OF THE DRAWINGS

The accompanying drawings are presented to describe examples of the present teachings, and are not provided as limitations.

Figure 1:
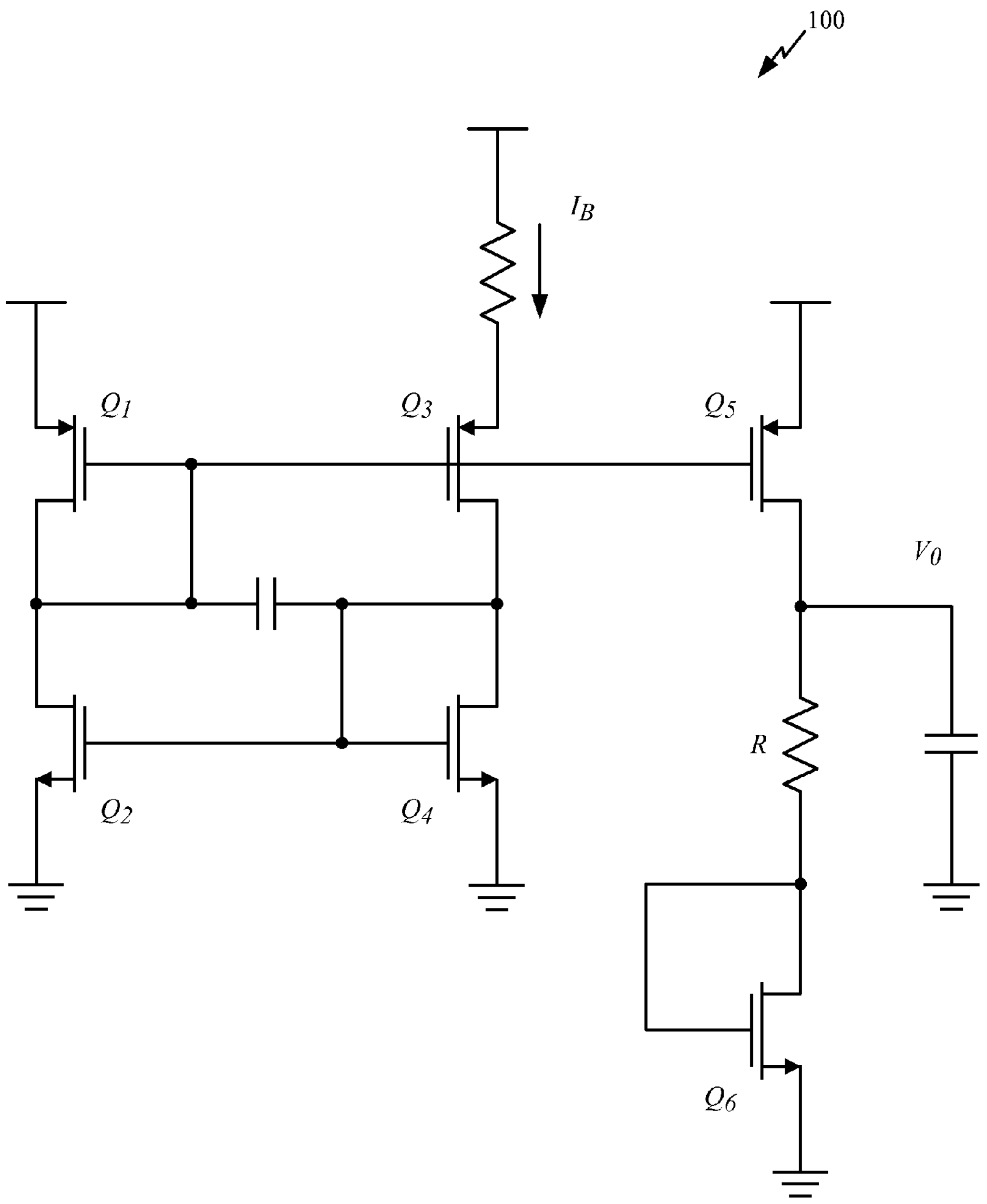
Prior Art FIG. 1
FIG. 1 depicts a conventional low-power voltage reference generator.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Examples of the current teachings are disclosed in this application's text and related drawings. The examples advantageously address the long-felt industry needs, as well as other previously unidentified needs, and mitigate shortcomings of the conventional methods and apparatus. Alternate embodiments may be devised without departing from the scope of the invention. Additionally, conventional elements of the current teachings may not be described in detail, or may be omitted, to avoid obscuring aspects of the current teachings.

The word "exemplary" is used herein to mean "serving as an example, instance, or illustration." Any embodiment described as "exemplary" is not necessarily to be construed as preferred or advantageous over other embodiments. Likewise, the term "embodiments of the invention" does not require that all embodiments of the invention include the discussed feature, advantage or mode of operation. Use of the terms "in one example," "an example," "in one feature" and/or "a feature" in this specification does not necessarily refer to the same feature and/or example. Furthermore, a particular feature and/or structure can be combined with one or more other features and/or structures.

It should be noted that the terms "connected," "coupled," and/or any variant thereof, mean any connection or coupling, either direct or indirect, between two or more elements, and can encompass the presence of an intermediate element between the two or more elements that are "connected" or "coupled" together. Coupling and connecting can be physical, logical, and/or a combination thereof. Two elements can be considered to be "connected" or "coupled" together with a wire, a cable, and/or a printed electrical connection, and/or with electromagnetic energy, such as electromagnetic energy having wavelengths in the radio frequency region, the microwave region and/or the optical (both visible and invisible) region, as several non-limiting and non-exhaustive examples.

It should be understood that the term "signal" can include any signal such as a data signal, audio signal, video signal, multimedia signal. Information and signals can be represented using any of a variety of different technologies and techniques. For example, data, instructions, commands, information, signals, bits, symbols, and chips that can be referenced throughout this description can be represented by voltages, currents, electromagnetic waves, magnetic fields or particles, optical fields or particles, and/or any combination thereof.

It should be understood that any reference to an element herein using a designation such as "first," "second," and so forth does not generally limit the quantity and order of those elements. Rather, these designations can be used as a convenient method of distinguishing between two or more elements, or instances of an element. Thus, a reference to first and second elements does not necessarily mean that only two elements are employed, or that the first element must precede the second element. Also, unless stated otherwise a set of elements can comprise one or more elements. In addition, terminology of the form "at least one of: A, B, or C" used in the description or the claims means "A or B or C or any combination of these elements."

The terminology used herein is for the purpose of describing particular embodiments only, and is not intended to limit an embodiment. The singular forms "a," "an," and "the" are intended to include the plural forms as well, unless the context clearly indicates otherwise. The terms "comprises," "comprising," "includes," and/or "including" specify the presence of a stated feature, integer, step, operation, element, and/or component, and do not preclude another feature, integer, step, operation, element, component, and/or group thereof.

In the following description, certain terminology is used to describe certain features. The term "mobile device" includes, but is not limited to, a mobile phone, a mobile communication device, personal digital assistant, mobile palm-held computer, a wireless device, and/or other types of mobile devices typically carried by individuals and/or having some form of communication capabilities (e.g., wireless, infrared, etc.).

INTRODUCTION

Methods and apparatus for a providing temperature-compensated reference voltage are provided. In an example, a temperature-compensated voltage reference circuit includes a current mirror portion and a temperature-compensated output portion coupled to the current mirror portion. The temperature-compensated output portion comprises a very low threshold voltage (Vt) transistor coupled in series with a negative temperature coefficient transistor. The output portion can further include a positive temperature coefficient element, such as an adjustable resistive element, coupled in series with the very low Vt transistor. The output portion can further include an output transistor having a gate coupled to the current mirror portion and coupled between a supply voltage and the positive temperature coefficient element. The very low Vt transistor can be a substantially zero Vt n-channel metal-oxide-semiconductor (NMOS) transistor, and can be coupled in a diode configuration.

DESCRIPTION OF THE FIGURES

Figure 2:
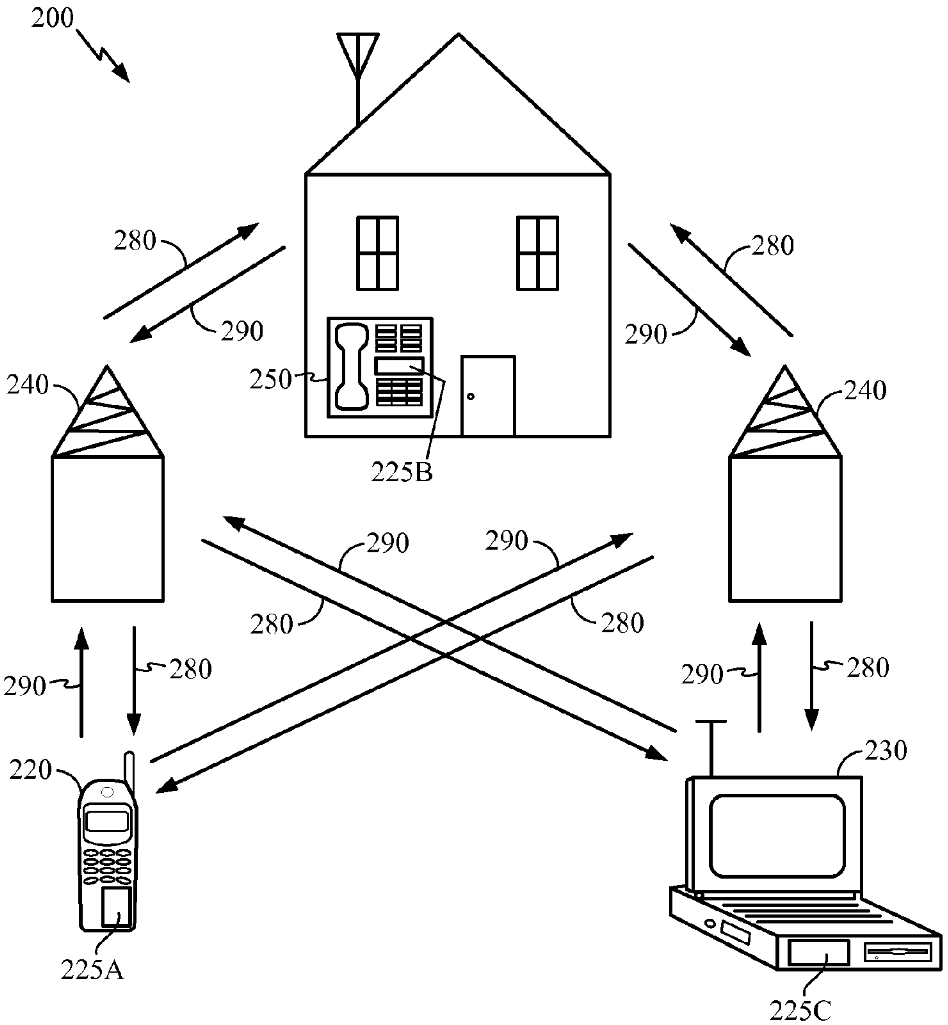
FIG. 2 depicts an exemplary communication system in which an embodiment of the disclosure may be advantageously employed.

FIG. 2 depicts an exemplary communication system 200 in which an embodiment of the disclosure may be advantageously employed. For purposes of illustration, FIG. 2 shows three remote units 220, 230, and 250 and two base stations 240. It will be recognized that conventional wireless communication systems may have many more remote units and base stations. The remote units 220, 230, and 250 include at least a part of an embodiment 225A-C of the disclosure as discussed further herein. FIG. 2 shows forward link signals 280 from the base stations 240 and the remote units 220, 230, and 250, as well as reverse link signals 290 from the remote units 220, 230, and 250 to the base stations 240.

In FIG. 2, the remote unit 220 is shown as a mobile telephone, the remote unit 230 is shown as a portable computer, and the remote unit 250 is shown as a fixed location remote unit in a wireless local loop system. In examples, the remote units can be mobile phones, hand-held personal communication systems (PCS) units, portable data units such as personal data assistants, GPS enabled devices, navigation devices, set-top boxes, music players, video players, entertainment units, fixed location data units such as meter reading equipment, or any other device that stores or retrieves data or computer instructions, or any combination thereof. Although FIG. 2 illustrates remote units according to the teachings of the disclosure, the disclosure is not limited to the exemplary illustrated units. Embodiments of the disclosure may be suitably employed in any device which includes active integrated circuitry including memory and on-chip circuitry for test and characterization.

Figure 3:
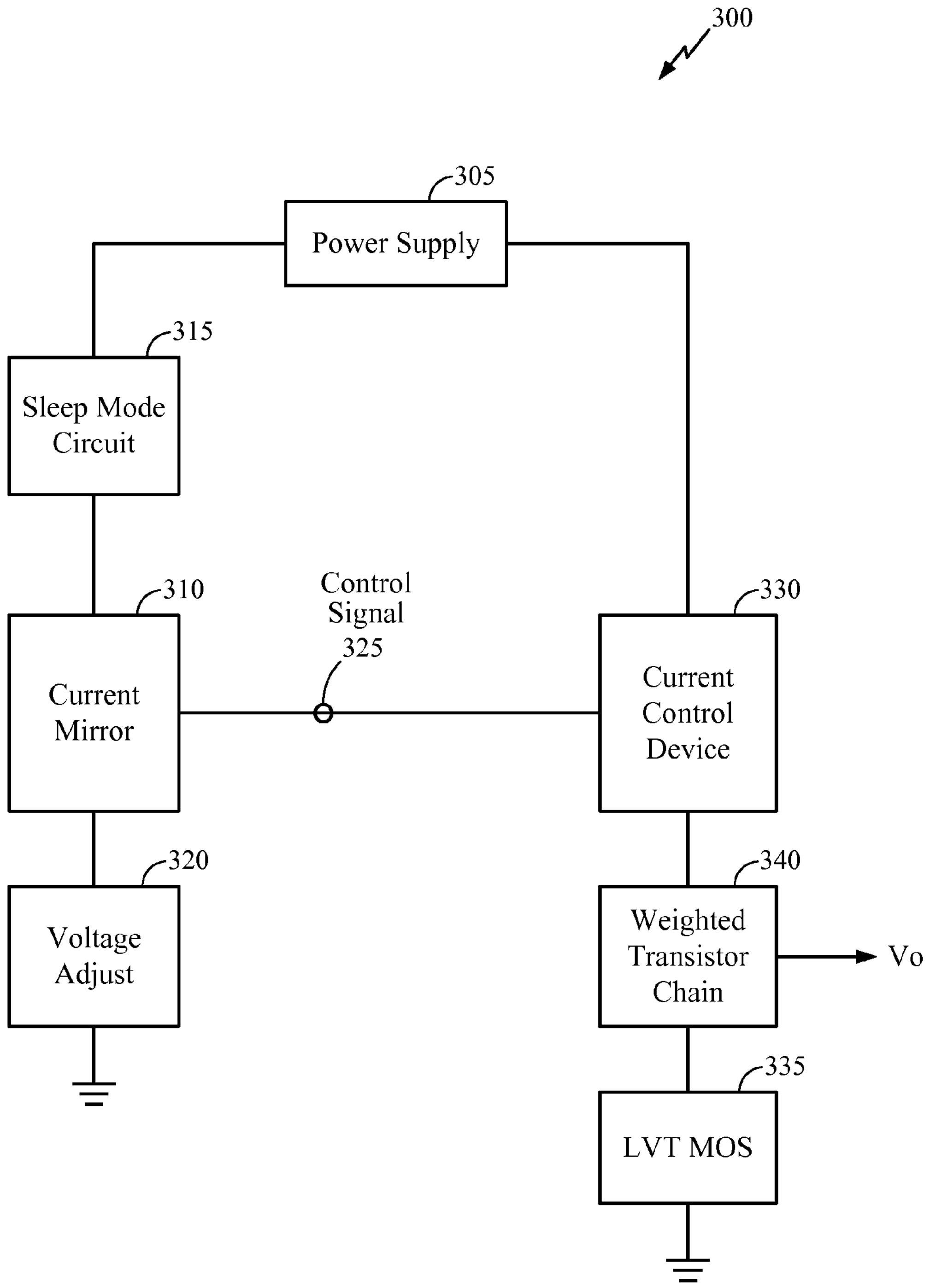
FIG. 3 depicts a block diagram of an exemplary voltage reference circuit that is temperature-compensated and operates with low-current.

FIG. 3 depicts a block diagram of an exemplary voltage reference circuit 300 that is temperature-compensated and operates with low-current. The voltage reference circuit 300 is powered with a power supply 305 that supplies a voltage higher than an output voltage (Vo) of the voltage reference circuit 300. The power supply 305 provides power to a current mirror 310 through an optional sleep mode circuit 315. A voltage adjust circuit 320 varies the output voltage (Vo) by varying the magnitude of a current and/or voltage provided to the current mirror 310 with a variable resistance, such as a transistor operating in a linear mode. The current mirror 310 converts the power from the power supply 305 into a control signal 325.

The control signal 325 maintains the output voltage (Vo) substantially constant for changes in temperature, voltage of the power supply 305, and process variations. The control signal 325 also adjusts a current control device 330 to change a magnitude of a current passed through a very-low threshold voltage (LVT) metal-oxide-semiconductor (MOS) transistor 335. In an example, the LVT 335 can be a zero threshold voltage transistor (ZVT). The output voltage (Vo) is developed at least in part in series with the LVT 335 as a result of the current flow through the LVT 335. A weighted transistor chain 340 can vary the output voltage (Vo) and provide multiple adjustable taps from which multiple output voltages, such as $Vo_{1-n}$ shown in FIG. 4, can be provided.

Regarding the LVT 335, in a MOS transistor, the threshold voltage (Vt) is a minimum voltage that must be applied to the transistor's gate to cause a current to flow between the transistor's source and drain. A MOS transistor having a very low threshold voltage can have a threshold voltage that is within a range, for example, from a depletion mode voltage of approximately −0.05 V, through a zero threshold voltage of substantially 0.0 V, to an enhancement mode voltage of approximately +0.5 V. A MOS transistor having a very low threshold voltage consumes very little power compared to conventional designs, and can be used in a circuit supplied with an ultra-low supply voltage.

One type of LVT 335 is the ZVT. The ZVT has a threshold voltage that is substantially zero volts. Compared to a conventional MOS transistor, the ZVT provides very fast switching at low voltages, because the ZVT requires less time for a transitioning control voltage to cause the ZVT to switch. The ZVT also has very low current leakage due to operating with the ultra-low supply voltage.

Figure 4:
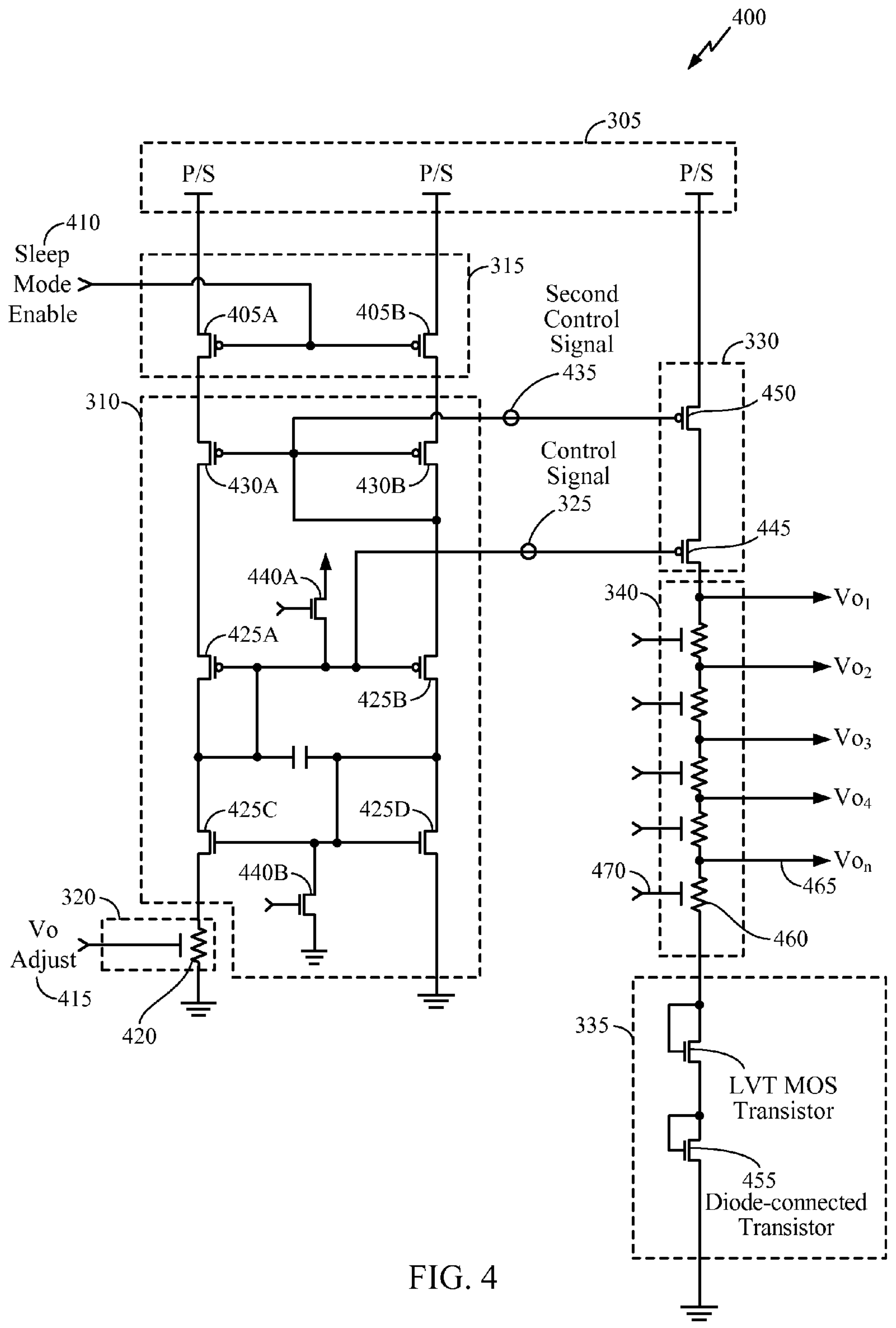
FIG. 4 depicts an exemplary voltage reference circuit that is temperature-compensated and operates with low-current.

FIG. 4 depicts another exemplary voltage reference circuit 400 that is temperature compensated and operates with low-current. The voltage reference circuit 400 has two portions. The first portion has the sleep mode circuit 315, the voltage adjust circuit 320, and a current mirror 310. The sleep mode circuit 315, voltage adjust circuit 320 and the current mirror 310 are powered by the power supply 305. The sleep mode circuit 315 has a pair of transistors 405A-B operating substantially similarly in a linear mode, and controlled by a sleep mode enable 410 input. The voltage adjust circuit 320 has a Vo adjust input 415, which varies an associated variable resistance 420 to control current through the current mirror 310. The current mirror 310 has cascaded PMOS (p-channel metal-oxide-semiconductor) transistor pairs 425 A-B and NMOS (n-channel metal-oxide-semiconductor) transistor pairs 425C-D to provide a matched current that has a low supply variation. The current mirror 310 converts the power supplied by the power supply 305 into the control signal 325, which is substantially constant for changes in temperature, voltage of the power supply 305, and process variations. The current mirror 310 also has a second feedback circuit, including transistors 430A-B, which generates a second control signal 435. A pair of jump start transistors 440A-B are configured to assist establishing a stable condition in the current mirror 310 upon start-up.

The second portion of the voltage reference circuit 400 is an output portion including the current control device 330 and the LVT 335. The control signal 325 adjusts a transistor 445 to change a magnitude of a current passed through the LVT 335. The second control signal 435 also adjusts a transistor 450 to change the magnitude of the current passed through the LVT 335. The LVT 335 is arranged as a diode, and includes a series-coupled negative temperature coefficient transistor 455 that is also arranged as a diode. The LVT 335 can be a zero threshold voltage transistor (ZVT). The LVT 335 can also be coupled in series with the weighted transistor chain 340. The weighted transistor chain 340 has at least one adjustable resistive element 460 having an associated tap 465, that is controlled by a respective output voltage adjust input 470. The output voltage ($Vo_{1-n}$) 310 is developed at least in part across the LVT 335 as a result of the current flow through the LVT 335.

In an example, at least a part of the exemplary voltage reference circuit 400 is integrated with a device, selected from the group consisting of a set-top box, music player, video player, entertainment unit, navigation device, communications device, personal digital assistant (PDA), fixed location data unit, and a computer. In an example, at least a part of the exemplary voltage reference circuit 400 can be integrated on a semiconductor die.

Figure 5:
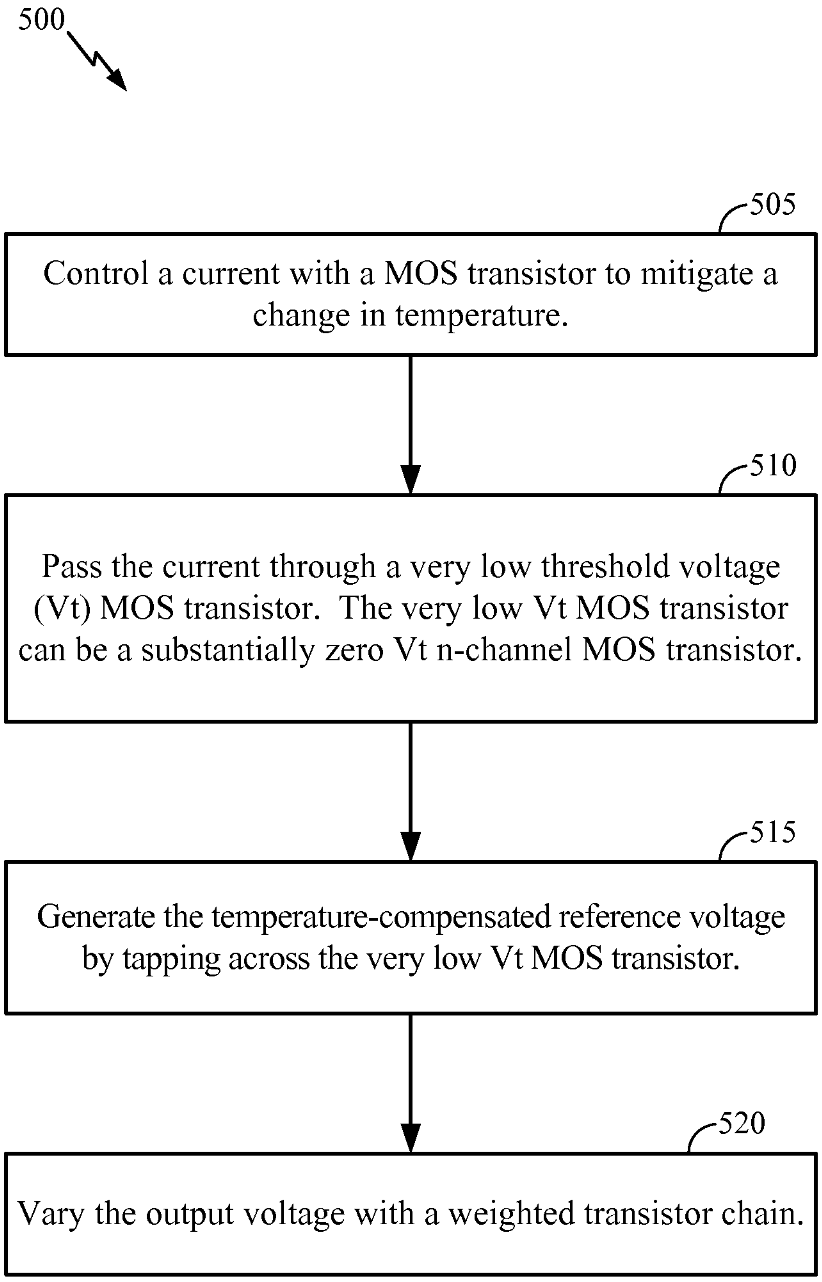
FIG. 5 depicts an exemplary method for providing a temperature-compensated reference voltage.

FIG. 5 depicts an exemplary method for providing a temperature-compensated reference voltage 500. The method for providing a temperature-compensated reference voltage 500 can be performed by the apparatus described hereby, such as the voltage reference circuit 300 and the voltage reference circuit 400.

In step 505, a current is controlled with a MOS transistor to mitigate a change in temperature.

In step 510, the current is passed through a very low threshold voltage (Vt) MOS transistor. The very low Vt MOS transistor can be a substantially zero Vt n-channel MOS transistor.

In step 515, the temperature-compensated reference voltage is generated by tapping across the very low Vt MOS transistor.

In step 520, the output voltage is varied with a weighted transistor chain.

The disclosed devices, and devices for implementing the disclosed methods, can be designed and configured into GDSII and GERBER computer files that are stored on a computer readable media. These files are in turn provided to fabrication handlers who fabricate devices, based on these files, with a lithographic device. The resulting products are semiconductor wafers that can be cut into semiconductor die and packaged into a semiconductor chip. The chips are then employed in devices described herein.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named “3rd Generation Partnership Project” (3GPP), while cdma2000 is described in documents from an organization named “3rd Generation Partnership Project 2” (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1xRTT, 1xEV-DO RelO, RevA, RevB) technology and other technologies. The techniques can be used in emerging and future networks and interfaces, including Long Term Evolution (LTE).

The methods, sequences, and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, “logic configured to” perform the described action.

An embodiment of the invention can include a computer readable media embodying at least a part of a method described herein. Accordingly, the invention is not limited to illustrated examples, and any means for performing the functionality described herein can be included in embodiments of the invention.

Nothing that has been stated or illustrated is intended to cause a dedication of any component, step, feature, object, benefit, advantage, or equivalent to the public, regardless of whether it is recited in the claims.

While this disclosure shows exemplary embodiments of the invention, it should be noted that various changes and modifications could be made herein without departing from the scope of the invention as defined by the appended claims.

The functions, steps and/or actions of the method claims in accordance with the embodiments of the invention described herein need not be performed in any particular order.

What is claimed is:

1. A temperature-compensated voltage reference circuit, comprising:

a current mirror portion including:

at least two cascaded transistor pairs configured to generate a first control signal, wherein the at least two cascaded transistor pairs include a first transistor pair of p-channel metal-oxide-semiconductor (PMOS) transistors and a second transistor pair of n-channel metal-oxide-semiconductor (NMOS) transistors;

a feedback circuit coupled to the at least two cascaded transistor pairs, wherein the feedback circuit includes a third transistor pair, and wherein the feedback circuit is configured to generate a second control signal; and a fourth transistor pair configured to establish a stable condition in the current mirror portion upon start-up, wherein the fourth transistor pair includes a first jump start transistor and a second jump start transistor, wherein the first jump start transistor is coupled to the first transistor pair, and wherein the second jump start transistor is coupled to the second transistor pair; and a temperature-compensated output portion coupled to the current mirror portion, wherein the temperature-compensated output portion comprises a very low threshold voltage (Vt) transistor coupled in series with a negative temperature coefficient transistor, and wherein the first control signal and the second control signal are configured to change a magnitude of a current through the temperature-compensated output portion.

2. The temperature-compensated voltage reference circuit of claim 1, wherein the temperature-compensated output portion further comprises:

a positive temperature coefficient element coupled in series with the very low Vt transistor.

3. The temperature-compensated voltage reference circuit of claim 1, further comprising:

a sleep mode circuit that includes a fifth transistor pair, wherein the sleep mode circuit is coupled to a power supply, wherein the sleep mode circuit is coupled to the third transistor pair, wherein the sleep mode circuit is controlled by a sleep mode enable input, and wherein the sleep mode circuit is configured to provide a voltage from the power supply to the current mirror portion.

4. The temperature-compensated voltage reference circuit of claim 1, further comprising:

a voltage adjust circuit having a voltage adjust input, the voltage adjust circuit configured to control a second magnitude of the current through the current mirror portion by varying a variable resistance.

5. The temperature-compensated voltage reference circuit of claim 4, wherein the voltage adjust circuit is coupled to a first NMOS transistor of the second transistor pair.

6. The temperature-compensated voltage reference circuit of claim 1, wherein the very low Vt transistor is coupled in a diode configuration.

7. The temperature-compensated voltage reference circuit of claim 1, wherein at least a part of the current mirror portion, at least a part of the temperature-compensated output portion, or a combination thereof, is integrated on a semiconductor die.

8. The temperature-compensated voltage reference circuit of claim 1, further comprising at least one of: a set-top box, music player, video player, entertainment unit, navigation device, communications device, personal digital assistant (PDA), fixed location data unit, or a computer, into which the current mirror portion and the temperature-compensated output portion are integrated.

9. A method for providing a temperature-compensated reference voltage, comprising:

controlling a current by sending a first control signal and a second control signal from a current mirror portion to a temperature-compensated output portion, wherein the current mirror portion includes at least two cascaded transistor pairs configured to generate the first control signal, and a feedback circuit coupled to the at least two cascaded transistor pairs, wherein the feedback circuit is configured to generate a second control signal, wherein the at least two cascaded transistor pairs include a first transistor pair of p-channel metal-oxide-semiconductor (PMOS) transistors and a second transistor pair of n-channel metal-oxide-semiconductor (NMOS) transistors, wherein the feedback circuit includes a third transistor pair, wherein a sleep mode circuit is coupled to the third transistor pair, wherein the sleep mode circuit includes a fourth transistor pair, wherein the sleep mode circuit is coupled to a power supply, wherein the sleep mode circuit is controlled by a sleep mode enable input, and wherein the sleep mode circuit is configured to provide a voltage from the power supply to the current mirror portion, and wherein the temperature-compensated output portion includes a very low threshold voltage (Vt) metal-oxide-semiconductor (MOS) transistor coupled in series with a negative temperature coefficient MOS transistor;

passing the current through the very low Vt MOS transistor and the negative temperature coefficient MOS transistor, wherein the first control signal and the second control signal are configured to change a magnitude of the current; and generating the temperature-compensated reference voltage using the very low Vt MOS transistor and the negative temperature coefficient MOS transistor.

10. The method of claim 9, further comprising varying the current with a weighted transistor chain.

11. The method of claim 9, wherein the very low Vt MOS transistor is a substantially zero Vt n-channel MOS transistor.

12. A temperature-compensated voltage reference circuit, comprising:

means for controlling a current including:

means for passing the current through at least two cascaded transistor pairs, wherein the at least two cascaded transistor pairs are configured to generate a first control signal, wherein the at least two cascaded transistor pairs include a first transistor pair of p-channel metal-oxide-semiconductor (PMOS) transistors and a second transistor pair of re-channel metal-oxide-semiconductor (NMOS) transistors; and means for passing the current through a feedback circuit, wherein the feedback circuit is coupled to the at least two cascaded transistor pairs, wherein the feedback circuit includes a third transistor pair, and wherein the feedback circuit is configured to generate a second control signal;

means for passing the current through a very low threshold voltage (Vt) metal-oxide-semiconductor (MOS) transistor coupled in series with a negative temperature coefficient MOS transistor, wherein the first control signal and the second control signal are configured to change a magnitude of the current; and means for passing the current through a voltage adjust circuit, wherein the voltage adjust circuit has a voltage adjust input, the voltage adjust circuit configured to control a second magnitude of the current through the means for controlling the current by varying a variable resistance.

13. The temperature-compensated voltage reference circuit of claim 12, further comprising means for varying the current with a weighted transistor chain.

14. The temperature-compensated voltage reference circuit of claim 12, wherein the very low Vt MOS transistor is a substantially zero Vt n-channel MOS transistor.

15. The temperature-compensated voltage reference circuit of claim 12, wherein at least a part of the means for controlling the current, at least a part of the means for passing the current, or a combination thereof, is integrated on a semiconductor die.

16. The temperature-compensated voltage reference circuit of claim 12, further comprising at least one of: a set-top box, music player, video player, entertainment unit, navigation device, communications device, personal digital assistant (PDA), fixed location data unit, or a computer, into which the means for controlling the current and the means for passing the current are integrated.

17. A non-transitory computer-readable medium, comprising instructions stored thereon that, if executed by a fabrication apparatus, cause the fabrication apparatus to fabricate at least a part of a device, comprising:

a current mirror portion including:

at least two cascaded transistor pairs configured to generate a first control signal, wherein the at least two cascaded transistor pairs include a first transistor pair of p-channel metal-oxide-semiconductor (PMOS) transistors and a second transistor pair of n-channel metal-oxide-semiconductor (NMOS) transistors; and a feedback circuit coupled to the at least two cascaded transistor pairs, wherein the feedback circuit includes a third transistor pair, and wherein the feedback circuit is configured to generate a second control signal;

a sleep mode circuit that includes a fourth transistor pair, wherein the sleep mode circuit is coupled to a power supply, wherein the sleep mode circuit is coupled to the third transistor pair, wherein the sleep mode circuit is controlled by a sleep mode enable input, and wherein the sleep mode circuit is configured to provide a voltage from the power supply to the current mirror portion; and a temperature-compensated output portion coupled to the current mirror portion, wherein the temperature-compensated output portion comprises a very low threshold voltage (Vt) transistor coupled in series with a negative temperature coefficient transistor, and wherein the first control signal and the second control signal are configured to change a magnitude of a current passed through the temperature-compensated output portion.

18. The non-transitory computer-readable medium of claim 17, wherein the temperature-compensated output portion of the device further comprises a positive temperature coefficient element coupled in series with the very low Vt transistor.

19. The non-transitory computer-readable medium of claim 18, wherein the positive temperature coefficient element is an adjustable resistive element.

20. The non-transitory computer-readable medium of claim 18, wherein the temperature-compensated output portion further comprises an output transistor having a gate coupled to the current mirror portion and coupled between a supply voltage and the positive temperature coefficient element.

21. The non-transitory computer-readable medium of claim 17, wherein the very low Vt transistor is a substantially zero Vt NMOS transistor.

* * * * *